US005528193A

United States Patent [19]

Maida

[11] Patent Number: 5,528,193

[45] Date of Patent: Jun. 18, 1996

[54] CIRCUIT FOR GENERATING ACCURATE VOLTAGE LEVELS BELOW SUBSTRATE VOLTAGE

[75] Inventor: Michael X. Maida, San Jose, Calif.

[73] Assignee: National Semiconductor Corporation, Santa Clara, Calif.

[21] Appl. No.: 342,812

[22] Filed: Nov. 21, 1994

[51] Int. Cl.[6] .......... H03K 3/01

[52] U.S. Cl. .......... 327/534; 327/535; 327/563

[58] Field of Search .......... 327/530, 531, 327/532, 533, 534, 535, 536, 537, 538, 309, 584, 560, 561, 562, 563; 330/253, 255, 257, 261, 258

[56] References Cited

U.S. PATENT DOCUMENTS

| | | | |
|---|---|---|---|
| 3,523,198 | 11/1967 | Keller | 327/584 |
| 3,961,208 | 6/1976 | Khanna | 327/584 |
| 4,451,747 | 5/1984 | Rucker, III | 327/309 |
| 4,700,125 | 10/1987 | Takata et al. | 327/537 |
| 4,705,966 | 11/1987 | Van Zanten | 327/537 |
| 4,727,332 | 2/1988 | Bundy | 327/309 |
| 4,736,153 | 4/1988 | Kogan | 327/537 |
| 5,041,795 | 8/1991 | Bowers | 327/561 |
| 5,047,707 | 9/1991 | Dixon et al. | 327/537 |
| 5,140,181 | 8/1992 | Yoshino | 327/563 |

*Primary Examiner*—John S. Heyman
*Assistant Examiner*—Kenneth B. Wells
*Attorney, Agent, or Firm*—Limbach & Limbach

[57] ABSTRACT

A simple operational amplifier is coupled to a pair of resistors such that a positive reference voltage is reliably converted to a negative voltage. The op amp includes a differential pair of pnp transistors to which is connected a npn transistor connected as an emitter follower. The op amp is constructed and operated such that the bases of the pnp transistors and the collector of the npn transistor never fall below ground voltage.

5 Claims, 2 Drawing Sheets

CIRCUIT FOR GENERATING ACCURATE VOLTAGE LEVELS BELOW SUBSTRATE VOLTAGE

FIELD OF THE INVENTION

The present invention relates to circuits using bipolar transistors for generating voltage levels below substrate voltage levels for use in video display applications. The present invention is particularly suited to generating a negative voltage swing for the gate driver of a Liquid Crystal Display (LCD) system.

BACKGROUND OF THE INVENTION

It is known in the prior art to provide voltage supplies below ground for various applications. However, these methods do not disclose how to provide the needed voltage supplies using a reduced number of integrated circuit (IC) chips, where each chip has its substrate connected to a ground potential. In such cases, providing an additional IC chip clamped to a specific voltage below ground would increase the size and cost of the overall device.

Furthermore, the prior art methods for providing below ground voltages on a substrate which is connected to ground result in forward-biased diodes located between the epitaxial layer and the substrate. The problem with using such forward biased diodes is that the overall device cannot span as great a voltage range because the voltage swing on one end will be limited by the forward voltage of the diode.

Also, other circuits are known in the prior art for generating voltages above ground, but these circuits have not been used to generate voltages below ground, in the manner contemplated by the present invention.

Other prior art circuits have employed diodes or transistors to clamp voltages in overload conditions, but not to provide a below-substrate voltage that is well defined.

SUMMARY OF THE INVENTION

The present invention is directed to a circuit for providing below-substrate voltages on an IC chip. The below-substrate voltages are achieved without the limitations resulting from forward biasing diodes connected between an epitaxial layer and the substrate. For example, a voltage swing between +12 V and −10 V can be achieved on the same substrate employing a process designed for 12 V.

According to an embodiment of the invention, the below substrate voltages are obtained by employing a circuit that utilizes a simple operational amplifier coupled to a pair of resisitors such that a positive reference voltage is reliably converted to a negative voltage. The op amp includes a differential pair of pnp transistors to which an npn transistor is connected as an emitter follower. The op amp is constructed and operated such that the bases of the pnp transistors and the collector of the npn transistor never fall below ground voltage.

A better understanding of the features and advantages of the present invention will be obtained by reference to the following detailed description and accompanying drawings which set for an illustrative embodiment in which the principles of the invention are utilized.

DETAILED DESCRIPTION OF THE PREFERRED EMBODIMENTS

Figure 1:
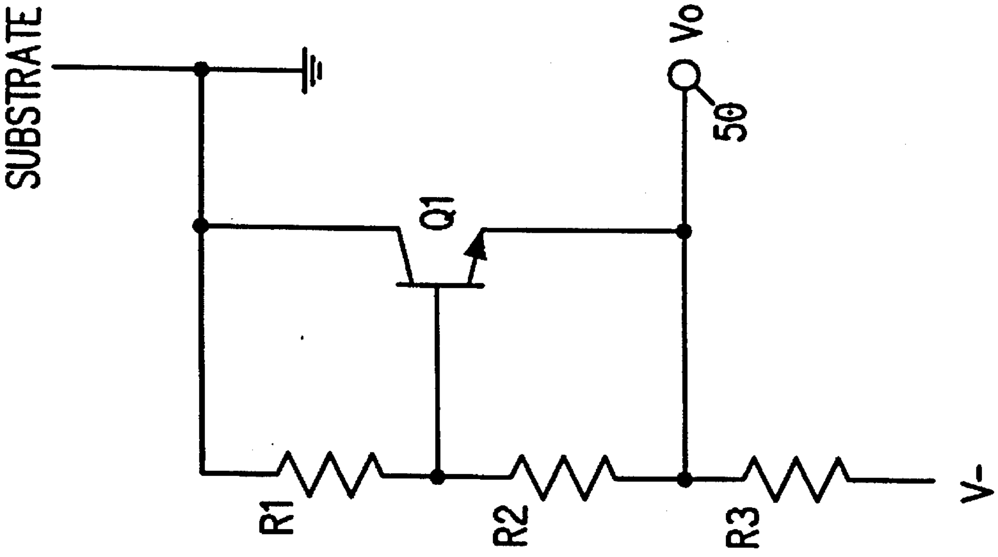
FIG. 1 is a schematic diagram illustrating a circuit utilizable for generating below substrate voltages according to one embodiment of the present invention.

FIG. 1 illustrates a circuit for generating below substrate voltages employing a voltage multiplier circuit having an output voltage (Vo, at output terminal 50) defined by the following equation:

$$Vo=(1+R_1/R_2)\times V_{BEQ1} \quad (1),$$

where $V_{BEQ1}$ is the base-emitter voltage of transistor $Q_1$.

As shown in FIG. 1, three resistors $R_1$, $R_2$ and $R_3$ are connected in series. NPN transistor $Q_1$ is connected such that its collector is grounded, its base is connected to the node at which resistors $R_1$ and $R_2$ intersect, and its emitter is connected to the node at which resistors $R_2$ and $R_3$ intersect. The end of resistor $R_3$ that is not connected to resistor $R_2$ is at a potential equal to V-. The value of resistor $R_3$ determines the emitter current of transistor $Q_1$ and is chosen such that the following equations are satisfied:

$$I_{R3}=|ABS(V-)-ABS(Vo)|/R_3 \quad (2);$$

$$I_{R3}> V_{BE}/R_2 \quad (3)$$

The circuit of FIG. 1 has limited application because of the large temperature coefficient of $V_{BE}$. Thus, it is sometimes impractical to use $V_{BE}$ as a reference.

Figure 2:
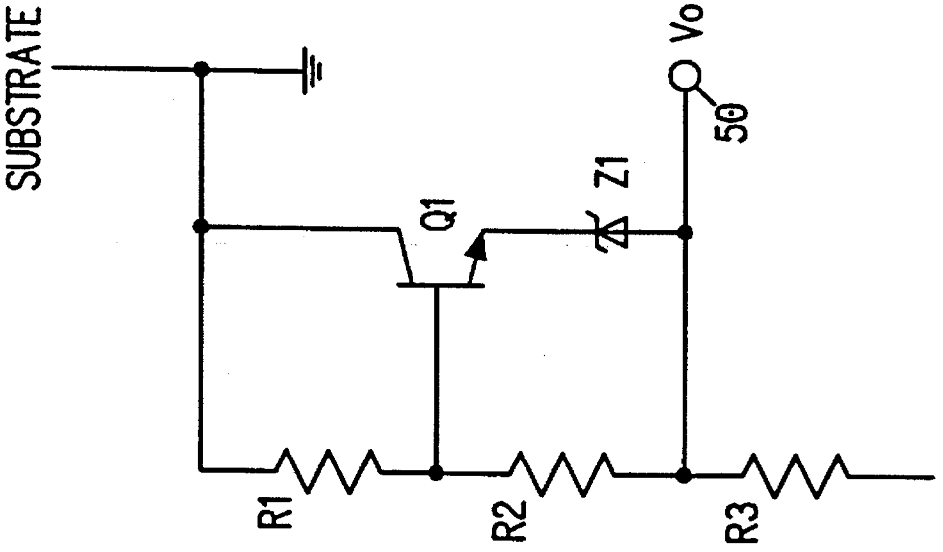
FIG. 2 is a schematic diagram illustrating another circuit utilizable for generating below substrate voltages according to another embodiment of the present invention.

Another circuit for generating below substrate voltages is shown in FIG. 2. This circuit is very similar to the circuit of FIG. 1 except that a zener diode $Z_1$ is located in series with the base-emitter junction of transistor $Q_1$. Like numerals are used in FIG. 2 for elements equivalent to those in FIG. 1 (ie. resistors $R_1$, $R_2$, $R_3$, and transistor $Q_1$). Thus, with the circuit of FIG. 2, Vo is defined as follows:

$$Vo=(1+R_{10}/R_{20})\times(V_{BE}+V_{Z1}) \quad (4),$$

where $V_{Z1}$ is the voltage drop across diode $Z_1$.

Unfortunately, zener diode characteristics are not predictable with a number of processes. Therefore, the output voltage Vo is not completely reliable in all cases and, thus, the FIG. 2 circuit also has limited application.

Figure 3:
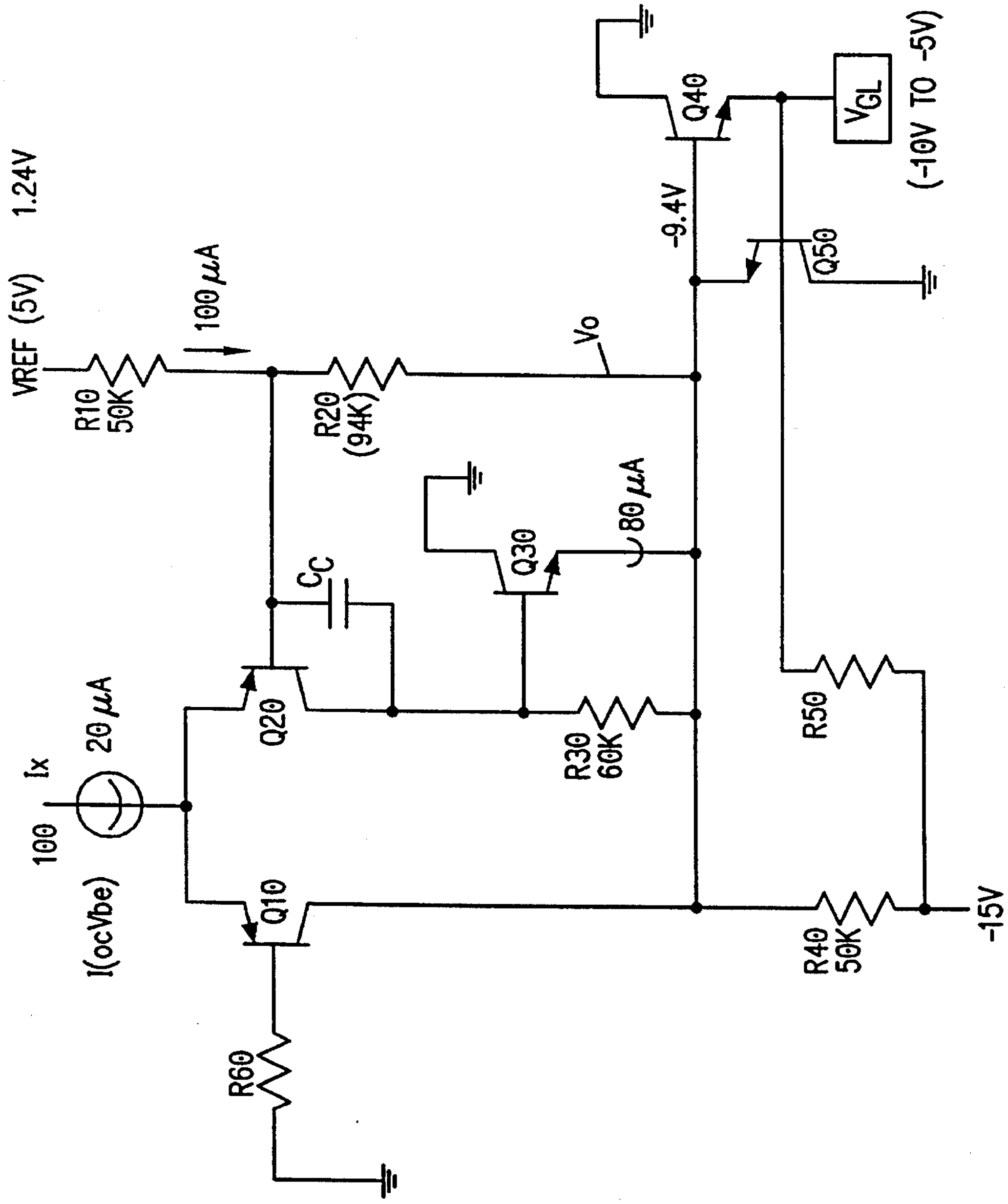
FIG. 3 is a schematic diagram illustrating a circuit for generating below substrate voltages according to a preferred embodiment of the present invention.

FIG. 3 illustrates a circuit for generating a negative reference voltage from a positive reference voltage $V_{REF}$, which may be produced from a bandgap reference voltage or an external supply voltage.

As shown in FIG. 3, a simple op amp is formed by transistors $Q_{10}$, $Q_{20}$ and $Q_{30}$ and resistors $R_{30}$ and $R_{40}$. Transistors $Q_{10}$ and $Q_{20}$ form a differential amplifier having a one-sided load represented by resistor $R_{30}$. Transistors $Q_{10}$ and $Q_{20}$ are pnp transistors having a current source 100 connected to the emitter of each transistor. Current source 100 transmits a current $I_x$. The collector of transistor $Q_{20}$ is coupled with the base of transistor $Q_{30}$.

In closed loop form, resistor $R_{20}$ provides negative feedback from the emitter of transistor $Q_{30}$ to the base of transistor $Q_{20}$. With the feedback loop thus closed, resistor $R_{30}$ draws a current equal to the $V_{BE}$ of transistor $Q_{30}$ divided by the resistance value of resistor $R_{30}$. The current through resistor $R_{30}$ sets the current flowing through transistor $Q_{20}$. As a result, the current which flows the transistor $Q_{10}$ is as follows:

$$IQ_{10}=I_x-IQ_{20} \quad (5)$$

The current flowing through transistor $Q_{30}$, is set in large part by the current flowing through resistor $R_{40}$ minus $I_x$, except for any residual current flowing through transistor $Q_{20}$. Generally speaking, the circuit is designed such that most of the current flowing through resistor $R_{40}$ also flows through transistor $Q_{30}$.

Current gain is provided by using the emitter follower transistor $Q_{30}$. The emitter follower transistor $Q_{30}$ must be an npn transistor to avoid forward biasing any diodes. Therefore, excess current must be drawn through resistor $R_{40}$ so that transistor $Q_{30}$ has enough current for proper biasing. It is possible to implement transistor $Q_{30}$ as a Darlington amplifier.

A reference voltage ($V_{REF}$) may be set at any desired voltage. In the preferred embodiment, a voltage of 2.5 volts may be used (of course, 1.25 V and 5 V may also be used). A pair of resistors $R_{10}$ and $R_{20}$ are connected in series between $V_{REF}$ and an output voltage Vo. With the arrangement shown in FIG. 3, Vo satisfies the following equation:

$$Vo=-(R_{20}/R_{10})\times V_{REF} \quad (6)$$

The FIG. 3 circuit is provided with optional components, e.g. resistor $R_{60}$ for electro-static discharge (ESD) protection; resistor $R_{60}$ compensates for the error due to the input bias current. Transistor $Q_{40}$ and resistor $R_{50}$ act as a voltage clamp. Transistor $Q_{50}$ acts as a clamp diode for transistor $Q_{40}$, but is not absolutely necessary. Capacitor $C_c$ provides frequency compensation. Voltage $V_{GL}$ is the deselect gate bias for an active matrix liquid crystal display.

Ideally current source $I_x$ should satisfy the following equation for minimum temperature variation of offset voltage:

$$I_x=2\times V_{BEQ3}/R_3 \quad (7)$$

However, satisfying this equation is not a strict requirement.

With the embodiment shown in FIG. 3 and the equations associated therewith, it is apparent that the collector of npn transistor $Q_{30}$ and the bases of pnp transistors $Q_{10}$ and $Q_{20}$ never swing below ground.

The resistance values of the resistors may be selected depending upon the system requirements. Resistance values that may be used in the circuit of FIG. 3 are hereby noted by way of example: $R_{10}$ =50k; $R_{20}$=94K; $R_{30}$=60k; $R_{40}$=50k; and $R_{60}$=10k.

Although the present invention has been disclosed with particular reference to the preferred embodiment, one of ordinary skill in the art would be enabled by this disclosure to make various modifications to this invention and still be within the scope and spirit of the present invention as embodied in the appended claims.

What is claimed is:

1. In a monolithic integrated circuit chip having a chip substrate voltage with, a voltage generator circuit for generating a voltage less than the chip substrate voltage by a predefined amount, the voltage generator circuit comprising:

first and second pnp transistors having their emitters commonly connected to a current source, the base of the first pnp transistor being coupled to a ground terminal;

a first npn transistor having its collector connected to the ground terminal, its emitter connected to an output terminal, and its base connected to the collector of the second pnp transistor;

a first resistor connected between a reference voltage terminal and the base of the second pnp transistor;

a second resistor connected between the base of the second pnp transistor and the output terminal;

a third resistor connected between the base of the first npn transistor and the output terminal; and a fourth resistor connected between the collector of the first pnp transistor and a negative voltage supply.

2. The voltage generator circuit as in claim 1 and wherein the base of the first pnp transistor is coupled to the ground terminal via a fifth resistor.

3. The voltage generator circuit as in claim 1 and further comprising a second npn transistor having its collector connected to the ground terminal, its emitter coupled to the negative voltage supply via a sixth resistor, and its base connected to the output terminal.

4. The voltage generator circuit as in claim 3 and further comprising a third npn transistor having its emitter connected to the output terminal, its collector connected to the ground terminal, and its base connected to the emitter of the second npn transistor.

5. The voltage generator circuit as in claim 1 and further comprising a capacitor connected between the base and the collector of the second pnp transistor.

* * * * *